United States Patent [19]
Koshikawa

[11] Patent Number: 5,397,984
[45] Date of Patent: Mar. 14, 1995

[54] INTEGRATED CIRCUIT FOR PROTECTING INTERNAL CIRCUITRY FROM HIGH VOLTAGE INPUT TEST SIGNALS

[75] Inventor: Yasuji Koshikawa, Tokyo, Japan
[73] Assignee: NEC Corporation, Tokyo, Japan
[21] Appl. No.: 10,166
[22] Filed: Jan. 28, 1993
[30] Foreign Application Priority Data
Jan. 30, 1992 [JP] Japan ................. 4-040324
[51] Int. Cl.⁶ .................................. G01R 31/28
[52] U.S. Cl. .................. 324/158.1; 324/73.1
[58] Field of Search .......... 324/158 R, 73.1, 765; 371/15.1, 22.1, 22.6, 22.5; 307/303.1; 437/8

[56] References Cited
U.S. PATENT DOCUMENTS

| | | |
|---|---|---|
| 5,012,185 | 4/1991 | Ohfuji .................. 324/158 R |
| 5,142,222 | 8/1992 | Tanaka et al. ........... 324/158 R |
| 5,168,219 | 12/1992 | Tanaka et al. ........... 324/158 R |

*Primary Examiner*—Vinh Nguyen
*Attorney, Agent, or Firm*—Sughrue, Mion, Zinn, Macpeak & Seas

[57] ABSTRACT

A semiconductor integrated circuit protected against a high voltage testing signal is provided. The integrated circuit includes a first-stage input circuit, a discriminating circuit, a power suppuly circuit and a connecting circuit. The input ends of the-input circuit and the discriminating circuit are connected to one preselected external terminal. The discriminating circuit renders a testing circuit drive signal active to activate when a testing instruction signal higher than an ordinary input signal voltage is applied to the external terminal. When the testing circuit drive signal is active, the power supply circuit disconnects at least one of the positive and negative poles of the power source having polarity opposite to that of the testing instruction signal from the input circuit, and the connecting circuit connects one of the positive and negative poles of the power source having the same polarity as that of the testing instruction signal to the output end of the input circuit.

5 Claims, 6 Drawing Sheets

INTEGRATED CIRCUIT FOR PROTECTING INTERNAL CIRCUITRY FROM HIGH VOLTAGE INPUT TEST SIGNALS

BACKGROUND OF THE INVENTION (1) Field of the Invention

This invention relates to a semiconductor integrated circuit, and more particularly to a semiconductor integrated circuit which has a function of entering a test mode when a voltage higher than a power source voltage is applied to an external terminal of the circuit.

(2) Description of the Related Art

In recent years, enhancement of the high integration of semiconductor integrated circuits has been and is proceeding, and this has led to progressively greater time required for a screening tests to distinguish between acceptable and defective products. This is a significant problem in the mass production of semiconductor integrated circuits. It is also a problem that, as the complication of semiconductor integrated circuits proceeds, circuit evaluation and analysis of defective products become more difficult. In most cases, as a countermeasure for the problems described above, various testing circuits are built into semiconductor integrated circuits in order to reduce the testing time or to facilitate circuit evaluation and analysis of defective products.

One methods of causing the testing circuit to enter a test mode in order to use a testing circuit is the super-voltage method wherein a voltage (hereinafter referred to as super-voltage) higher than a power source voltage by a fixed level or more is applied to a particular external terminal. In this instance, a super-voltage discriminating circuit to which the super-voltage is inputted outputs a testing circuit drive signal for activating the testing circuit.

FIG. 1 is a circuit diagram showing part of a semiconductor integrated circuit of the prior art to which the super-voltage method is applied. In this circuit configuration, a semiconductor integrated circuit 300 is a semiconductor storage device, and an address pin 35 is selected for application of a super-voltage. A first-stage input circuit 31 and a super-voltage discriminating circuit (hereinafter referred to simply as the discriminating circuit) 32 are connected to the address pin 35.

The first-stage input circuit 31 includes P-channel MOS transistor Tr5 and N-channel MOS transistor Tr6 which are connected so as to form a CMOS inverter, and N-channel MOS transistor Tr7 which connects the gate of N-channel MOS transistor Tr6 to the address pin 35. Transistor Tr7 drops a signal voltage applied to the gate of transistor Tr6. The first-stage input circuit 31 having the construction just described is disclosed in Japanese Patent Laid-Open No. Heisei 4-123388.

The discriminating circuit 32 includes a pair of N-channel MOS transistors Tr1 and Tr2 and P-channel MOS transistor Tr4 connected in series to the address pin 35, P-channel MOS transistor Tr3 which supplies the power source voltage to the gate of transistor Tr4, a resistor R having a high resistance and connecting the other end of transistor Tr4 to the ground, an inverter IV1 having an input end connected to a junction between transistor Tr4 and the resistor R, and another inverter IV2 having an input end connected to the output end of inverter IV1 and outputting a testing circuit drive signal SVT.

In order for drive signal SVT of discriminating circuit 32 to have the high level, it is necessary for voltage VG at the input end of inverter IV1 to be higher than the input threshold level of inverter IV1. Where the voltage drops by transistors Tr1, Tr2 and Tr4 in the ON state are represented by VT1, VT2 and VT4, respectively, and the power source voltage and the voltage of input signal AD are represented by VCC and VAD, respectively, voltage VG is represented by the following equation:

$$VG = VAD - VT1 - VT2 - VT3 - VCC$$

(The resistance of resistor R is set to a sufficiently high value).

Accordingly, when the voltage of input signal AD is equal to or higher than a particular fixed level, drive signal SVT presents the high level, but when the voltage is lower than the particular fixed, level, drive signal SVT presents the low level.

Normally, voltage VAD at which drive signal SVT is changed over to the high level is set higher than an input pin applied voltage specified by the absolute maximum rated voltage in order to prevent unwanted entry into the testing mode. The high level of drive signal SVT is latched in response to a momentary super-voltage by a latch circuit (not shown) so that the super-voltage may be prevented from being applied for a long period of time, thereby preventing the otherwise possible destruction of the transistors.

FIG. 2 is a circuit diagram showing another example of a semiconductor integrated circuit of the prior art to which the super-voltage method is applied. In the semiconductor integrated circuit, an external terminal 37 is selected for application of a super-voltage.

Output circuit 33 includes a pair of N-channel MOS transistors Tr10 and Tr11 to which internal signals DTP and DTN are inputted by way of inverters IV5 and IV6, respectively. When signal DTP is at the high level and signal DTN is at the low level, output end D2 presents the low level, but when signal DTP is at the low level and signal DTN is at the high level, output end D2 presents the high level. On the other hand, when both signals DTP and DTN present the high level, output end D2 presents a high impedance state. Normally, a super-voltage is applied to the external terminal 37 when output end D2 presents a high impedance state. The discriminating circuit 32 has the same configuration as that of FIG. 1 and outputs drive signal SVT to activate a testing circuit when it detects a super-voltage. When a super-voltage is applied to the external terminal 37, it is applied between the gates of transistors Tr10 and Tr11 and output end D2.

In any of the prior art semiconductor integrated circuits described above, the short-term application of a considerably high-voltage super-voltage to the particular external terminal may cause the problem that the high potential difference produced between the gate and drain D1 of P-channel MOS transistor Tr of the first-stage input circuit may destroy the gate oxide film constituting the transistors, as shown in the semiconductor integrated circuit shown in FIG. 1. This problem is becoming increasingly severe with the reduction of thickness of gate oxide film accompanying the recent increases in high integration.

SUMMARY OF THE INVENTION

The present invention is intended to provide a semiconductor integrated circuit which eliminates the problems described above. It is an object of the present invention to provide a semiconductor integrated circuit wherein, when a super-voltage is applied to an internal circuit connected to an external terminal, the voltage to be applied to various elements constituting the internal circuit and the time for which the super-voltage is to be applied are reduced in order to protect the internal circuit.

It is another object of the present invention to provide a semiconductor integrated circuit wherein, when an internal circuit is a first-stage input circuit or an output circuit and is constituted of MOS transistors, a super-voltage itself is prevented from being applied between the gates and the sources or drains of the MOS transistors.

In order to attain the objects, according to one aspect of the present invention, there is provided a semiconductor integrated circuit which comprises a first-stage input circuit having first and second power source connecting ends through which a power source is supplied to the first-stage input circuit, an input end connected to one external terminal of the semiconductor integrated circuit selected in advance, and an output end connected to a succeeding internal circuit of the semiconductor integrated circuit, a discriminating circuit for rendering a testing circuit drive signal active to activate a testing circuit when a testing instruction signal higher by a predetermined voltage or more than an ordinary input signal voltage is applied to the external terminal, a power supply circuit for connecting the positive and negative poles of the power source to the first and second power source connecting ends of the first-stage input circuit, respectively, when the testing circuit drive signal is not active but for disconnecting at least one of the positive and negative poles of the power source having polarity opposite to that of the testing instruction signal from the first-stage input circuit when the testing circuit drive signal is active, and a connecting circuit for connecting one of the positive and negative poles of the power source having the same polarity as that of the testing instruction signal to the output end of the first-stage input circuit when the testing circuit drive signal is active.

Preferably, the first-stage input circuit is a CMOS inverter and the first power source connecting end is provided on the P-channel MOS transistor side of the CMOS inverter and connected to the positive pole of the power source while the second power source connecting end is provided on the N-channel MOS transistor side of the CMOS inverter and is connected to the negative pole of the power source by way of the power supply circuit, the testing instruction signal being active when it has positive polarity whereas the testing circuit drive signal is active when it has positive polarity, and the power supply circuit is a P-channel MOS transistor which receives, at the gate thereof, the testing circuit drive signal while the connecting circuit is an N-channel MOS transistor which receives, at the gate thereof, the testing circuit drive signal.

Preferably, the power supply circuit is, in place of the P-channel MOS transistor described above, an N-channel MOS transistor which receives, at the gate thereof, the testing circuit drive signal by way of an inverter while the connecting circuit is a P-channel MOS transistor which receives, at the gate thereof, the output of the inverter.

According to another aspect of the present invention, there is provided a semiconductor integrated circuit which comprises an output circuit having first and second power source connecting ends through which a power source is supplied to the output circuit, an output end connected to one external terminal of the semiconductor integrated circuit selected in advance, and an input end connected to a succeeding internal circuit of the semiconductor integrated circuit, a discriminating circuit for rendering a testing circuit drive signal active to activate a testing circuit when a testing instruction signal higher than an ordinary input signal voltage by a predetermined voltage or more is applied to the external terminal, a power supply circuit for connecting the positive and negative poles of the power source to the first and second power source connecting ends of the output circuit, respectively, when the testing circuit drive signal is not active but for disconnecting at least one of the positive and negative poles of the power source having the polarity opposite to that of the testing instruction signal from the output circuit when the testing circuit drive signal is active, and a connecting circuit for connecting one of the positive and negative poles of the power source having the same polarity as that of the testing instruction signal to the input end of the output circuit when the testing circuit drive signal is active.

Preferably, the output circuit includes first and second N-channel MOS transistors connected in series, the first power source connecting end is provided on the first N-channel MOS transistor side and connected to the positive pole of the power source while the second power source connecting end is provided on the second N-channel MOS transistor side and connected to the negative pole of the power source by way of the power supply circuit, the power supply circuit is an N-channel MOS transistor which receives, at the gate thereof, the testing circuit drive signal by way of an inverter while the connecting circuit includes a first NAND circuit having an output end connected to the gate of the first N-channel MOS transistor, an input end to which a first internal signal is applied and another input end to which the output of the inverter is applied, and a second NAND circuit having an output end connected to the gate of the second N-channel MOS transistor, an input end to which a second internal signal is applied and another input end to which the output of the inverter is applied.

The above and other objects, features and advantages of the present invention will become apparent from the following description and the appended claims, taken in conjunction with the accompanying drawings.

DETAILED DESCRIPTION OF THE EMBODIMENTS

Figure 3:
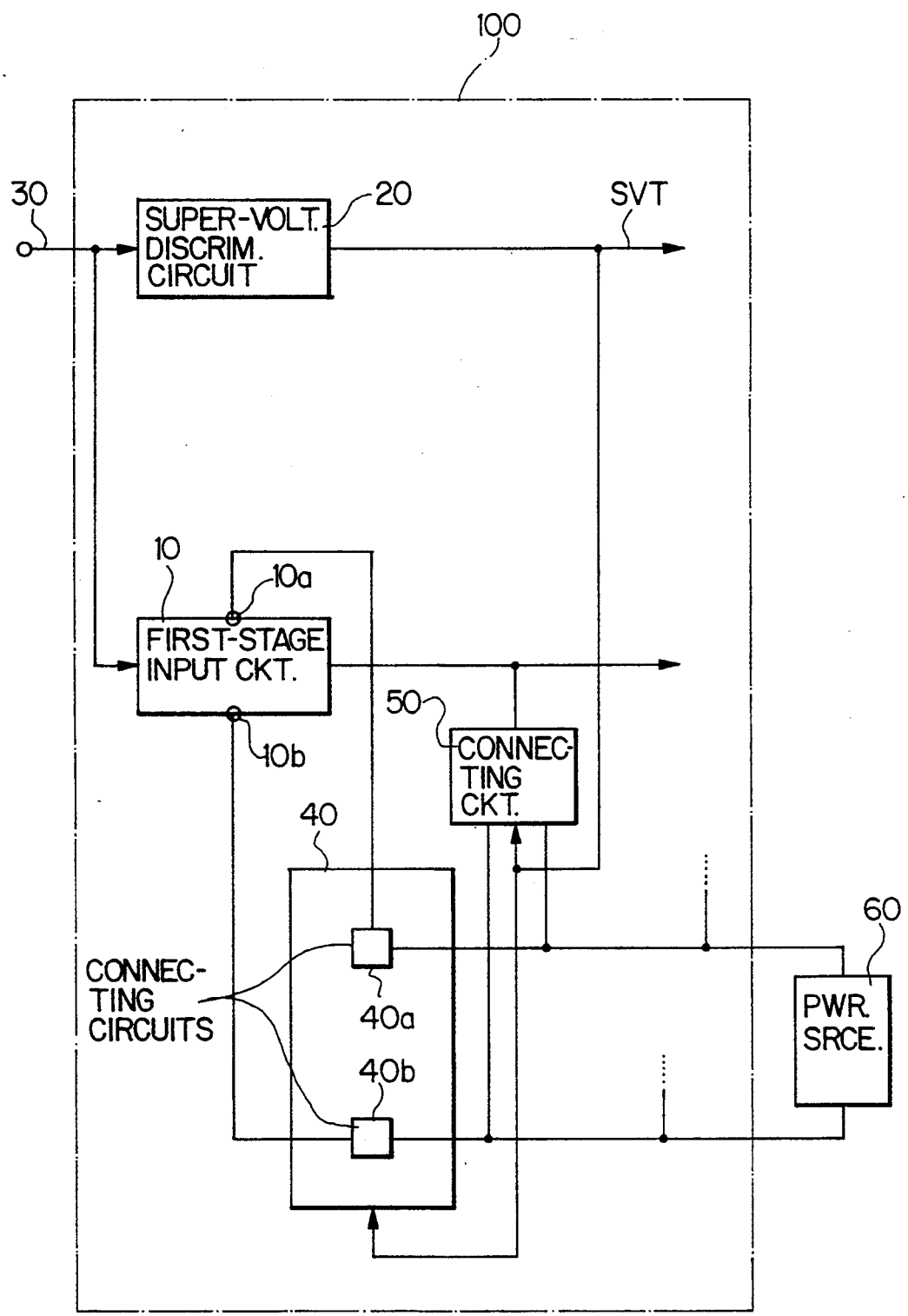
FIG. 3 is a block diagram of a semiconductor integrated circuit showing a preferred embodiment of the present invention.

Preferred embodiments of the present invention are described below with reference to the drawings. FIG. 3 is a block diagram showing a semiconductor integrated circuit according to a preferred embodiment of the present invention.

Integrated circuit 100 has a plurality of external terminals (only external terminal 30 is shown in FIG. 3 for simplification), and power is supplied from power source 60 to integrated circuit 100.

An external terminal 30 is selected in advance for application of a super-voltage. The first-stage input circuit 10 receives an input signal applied to the external terminal 30 and outputs an output signal to a succeeding internal circuit.

When a super-voltage (in the present embodiment, a voltage about twice as high as the voltage of power source 60) which is a testing instruction signal is applied to the external terminal 30, the super-voltage discriminating circuit 20 renders the testing circuit drive signal SVT active and causes a testing circuit (not shown) to perform a test. The testing circuit is generally built into the integrated circuit 100.

When drive signal SVT is inactive, the power supply circuit 40 connects the positive and negative terminals of the power source 60 to the power source connecting ends 10a and 10b of the first-stage input circuit 10 by way of connecting elements 40a and 40b, respectively. On the other hand, when drive signal SVT is active, the power supply circuit 40 disconnects from the first-stage input circuit 10 at least one of the positive and negative terminals of the power source 60 which has polarity opposite to that of the super-voltage.

When drive signal SVT is inactive, the connecting circuit 50 does not connect the power source 60 to the output end of the first-stage input circuit 10, but when drive signal SVT is active, connects to the output end of the first-stage input circuit 10 the positive or negative terminal of the power source 60 which has the same polarity as the super-voltage.

Figure 4:
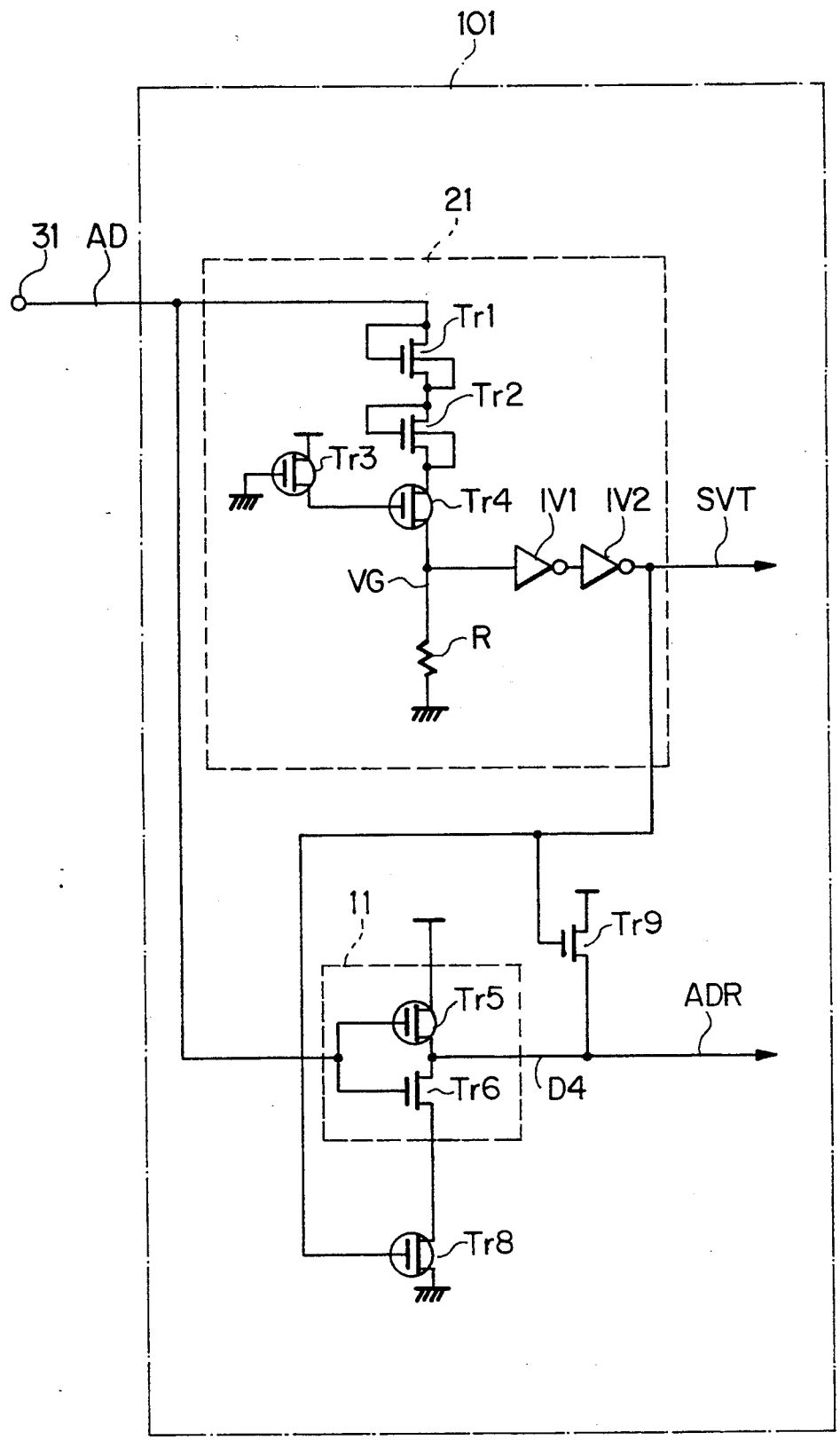
FIG. 4 is a circuit diagram showing a more detailed configuration of the semiconductor integrated circuit of FIG. 3.

FIG. 4 is a circuit diagram showing the configuration of a concrete semiconductor integrated circuit corresponding to the embodiment of FIG. 3. In the circuit shown in FIG. 4, all components operate in positive logic.

Semiconductor integrated circuit 101 is a semiconductor storage device, and address terminal 31 is selected for application of a super-voltage. The input ends of the first-stage input circuit 11 and the super-voltage discriminating circuit 21 are connected to address terminal 31. The first-stage input circuit 11 is a CMOS inverter and includes P-channel MOS transistor Tr5 and N-channel MOS transistor Tr6.

The discriminating circuit 21 includes a pair of N-channel MOS transistors Tr1 and Tr2 and P-channel MOS transistor Tr4 connected in series to address terminal 31, P-channel MOS transistor Tr3, which supplies a power source voltage to the gate of transistor Tr4, resistor R having a high resistance and connecting the other end of transistor Tr4 to the ground, inverter IV1 having an input end connected to a junction between transistor Tr4 and resistor R, and another inverter IV2 having an input end connected to the output end of inverter IV1 and outputting test circuit drive signal SVT.

In the first-stage input circuit 11, the positive terminal of the power source is connected directly to transistor Tr5, and the negative terminal (ground) of the power source is connected to transistor Tr6 by way of P-channel MOS transistor Tr8. In contrast with FIG. 3, the connecting element 40a in the power supply circuit 40 is a connecting wire (e.g.), and the connecting element 40b is transistor Tr8. Meanwhile, the connecting circuit 50 is N-channel MOS transistor Tr9.

The operation of the semiconductor storage device of FIG. 4 will next be described. When input signal AD applied to address terminal 31 is an ordinary address signal, the transistor Tr4 of the discriminating circuit 21 is not turned on. As a result, both voltage VG and drive signal SVT present the low level, and consequently, the testing circuit is not rendered operative. Further, since drive signal SVT is at the low level, transistor Tr8 presents an on-state and transistor Tr9 presents an off-state, and consequently, the first-stage input circuit 11 acts as an ordinary CMOS inverter. Accordingly, the input circuit 11 inverts the logic level of address signal AD and delivers output signal ADR to a circuit at a succeeding stage which is not shown (for example, an address decoder).

When input signal AD is a super-voltage (for example, a voltage twice as high as the power source voltage), transistor Tr4 is turned on, and consequently, both voltage VG and drive signal SVT present the high level. In this instance, the super-voltage is applied to address terminal 31 at a timing other than a read timing or a write timing.

Since drive signal SVT is at the high level, transistor Tr8 is turned off and transistor Tr9 is turned on, and consequently, the first-stage input circuit 11 is disconnected from the ground. Meanwhile, since transistor Tr9 is in an on-state, the output end D4 of first-stage input circuit 11 is connected to the power source by way of transistor Tr9. Accordingly, the super-voltage will not be applied between the end D4 and the gates of transistors Tr5 and Tr6. As a result, the first-stage input circuit 11 is protected from the super-voltage. When the super-voltage is applied, there may be a delay time until transistor is turned off and transistor Tr9 is turned on. But the delay time is very short compared with the time the super-voltage is applied. Therefore, the delay does no damage to the input circuit.

Figure 1:
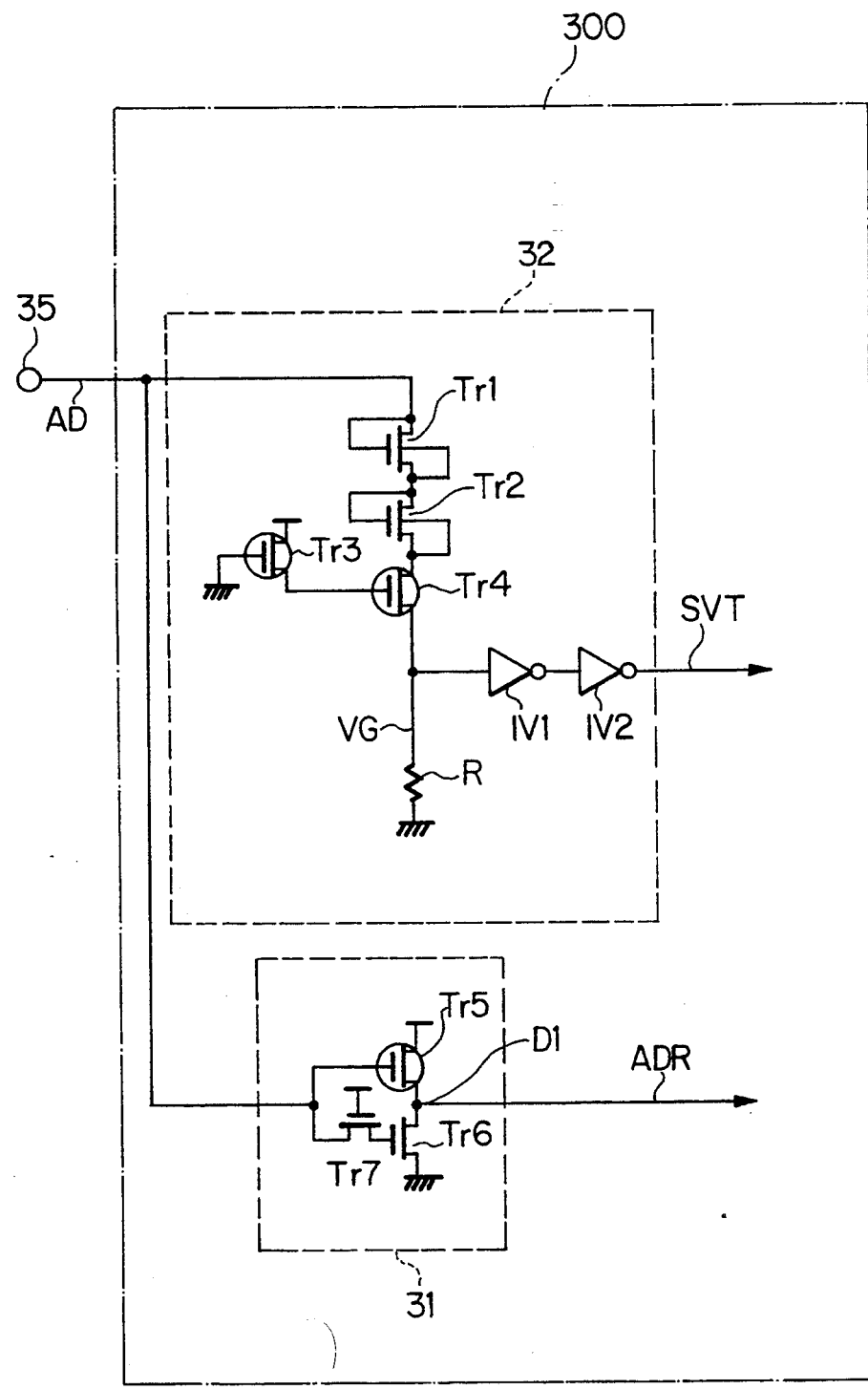
FIG. 1 is a circuit diagram showing a semiconductor integrated circuit of the prior art.
Figure 5:
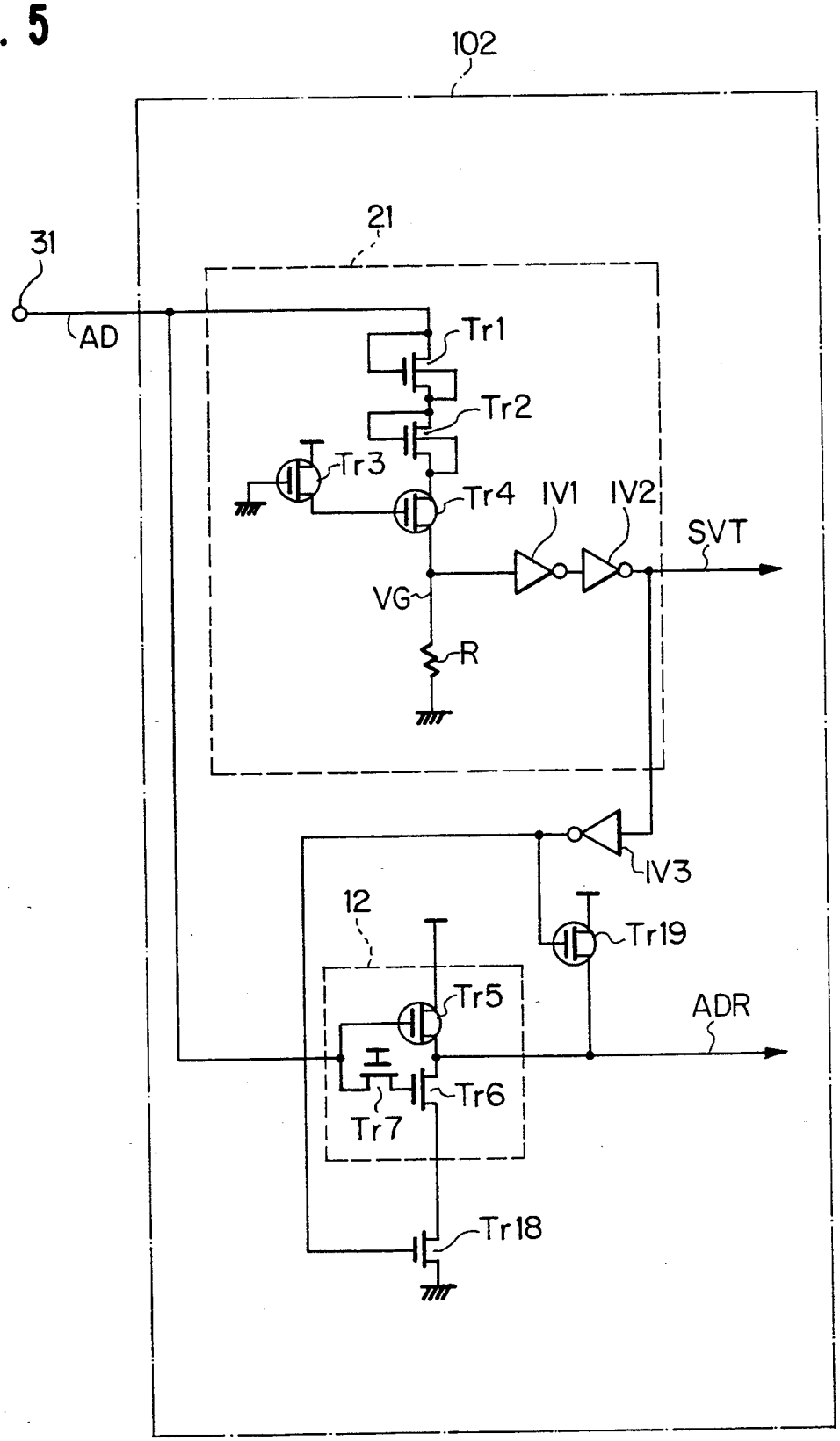
FIG. 5 is a circuit diagram showing a semiconductor integrated circuit wherein the present invention is applied to the circuit configuration of the prior art shown in FIG. 1.

FIG. 5 is a circuit diagram showing a semiconductor integrated circuit wherein the present invention is applied to the prior art circuit configuration shown in FIG. 1. Transistors Tr8 and Tr9 of FIG. 4 are replaced by N-channel transistor Tr18 and P-channel transistor Tr19, respectively. This is because drive signal SVT is applied to the gates of transistors Tr18 and Tr19 by way of inverter IV3.

Figure 2:
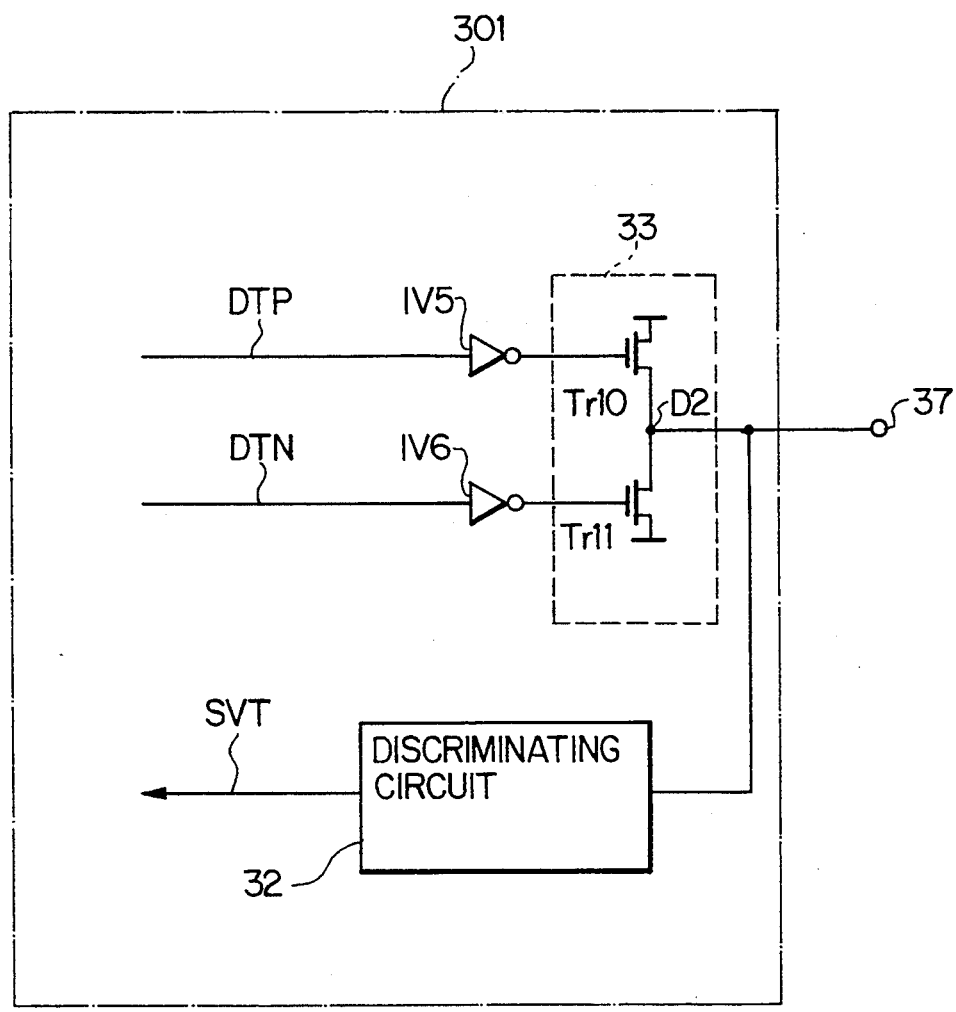
FIG. 2 is a circuit diagram showing another semiconductor integrated circuit of the prior art.
Figure 6:
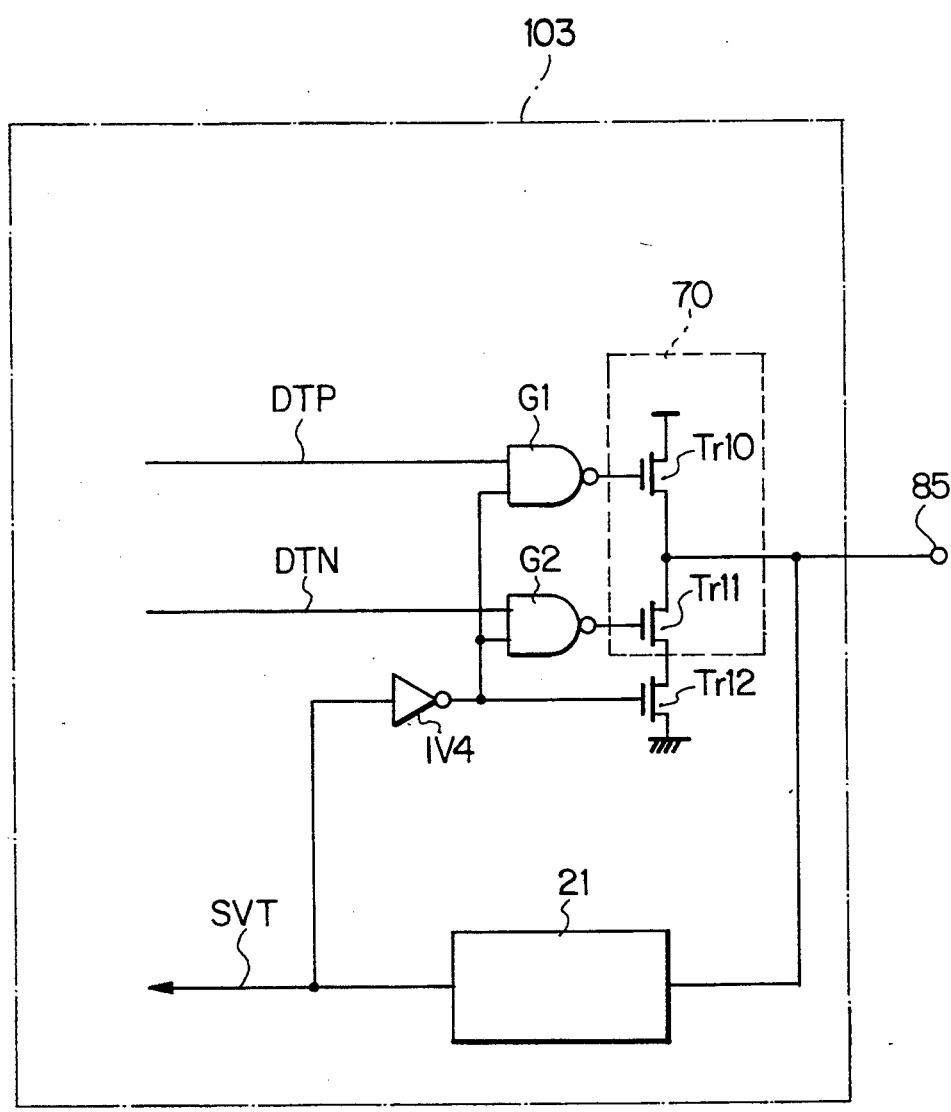
FIG. 6 is a circuit diagram showing a semiconductor integrated circuit wherein the present invention is applied to the prior art circuit configuration shown in FIG. 2.

FIG. 6 is a circuit diagram showing another embodiment of the present invention. The embodiment of FIG. 6 is a semiconductor integrated circuit wherein the present invention is applied to the prior art circuit configuration shown in FIG. 2.

In semiconductor integrated circuit 103, the output end of output circuit 70, which consists of a pair of N-channel MOS transistors Tr10 and Tr11, is connected to output terminal 85. When a super-voltage is applied to output terminal 85, a testing circuit is rendered operative. N-channel MOS transistor Tr12 is connected between transistor Tr11 of the output circuit 70 and the ground. Drive signal SVT is applied to the gate of transistor Tr12 by way of inverter IV4.

The output end of NAND circuit G1 is connected to the gate of transistor Tr10, and internal signal DTP is applied to one of a pair of input ends of NAND circuit G1 while the output of inverter IV4 is applied to the other input end of NAND circuit G1.

The output end of NAND circuit G2 is connected to the gate of transistor Tr11, and internal signal DTN is applied to one of a pair of input ends of NAND circuit G2 while the output of inverter IV4 is applied to the other input end of NAND circuit G2.

Accordingly, when a super-voltage is applied to the output terminal 85 so that drive signal SVT is switched to the high level, transistor Tr12 is turned off so that the voltage levels of the gates of transistors Tr10 and Tr11 are made equal to the power source voltage level. Consequently, the super-voltage will not be applied at all between the gates and the sources and drains of the transistors Tr10 and Tr11.

The invention may be embodied in other specific forms without departing from its spirit or essential characteristics. The described embodiments are to be considered in all respects only as illustrative and not restrictive and the scope of the invention is, therefore, indicated by the appended claims rather than by the foregoing description. All changes which come within the meaning and range of equivalency of the claims are to be embraced within the scope of the invention.

What is claimed is:

1. A semiconductor integrated circuit, comprising:
    a circuit having first and second power source connecting ends through which a power source is supplied to said circuit, a first end connected to one preselected external terminal of said semiconductor integrated circuit, and a second end;
    a discriminating circuit for providing a testing circuit drive signal for testing said semiconductor integrated circuit when a testing instruction signal higher than an ordinary input signal voltage by a predetermined voltage or more is applied to the external terminal;
    a power supply circuit, connected to the testing circuit drive signal from the discriminating circuit, for connecting the positive and negative poles of said power source to said first and second power source connecting ends of said circuit, respectively, when the testing circuit drive signal is not active, but for disconnecting at least one of said positive and negative poles of said power source having polarity opposite to that of the testing instruction signal from said circuit when the testing circuit drive signal is active; and
    a connecting circuit, connected to the testing circuit drive signal from the discriminating circuit, for connecting one of said positive and negative poles of said power source having the same polarity as that of the testing instruction signal to the second end of said circuit when the testing circuit drive signal is active.

2. A semiconductor integrated circuit as claimed in claim 1, wherein said positive pole of said power source is connected to said first power source connecting end of said circuit while said negative pole of said power source is connected to said second power source connecting end by way of said power supply circuit, and the testing instruction signal is active when said testing instruction signal has positive polarity whereas the testing circuit drive signal is active when said testing circuit drive signal has positive polarity.

3. A semiconductor integrated circuit as claimed in claim 2, wherein said circuit is a CMOS inverter comprising a P-channel MOS transistor and an N-channel MOS transistor, and said first power source connecting end is provided on a P-channel MOS transistor side of said CMOS inverter while said second power source connecting end is provided on an N-channel MOS transistor side of said CMOS inverter, and said power supply circuit is a P-channel MOS transistor which receives, at the gate thereof, the testing circuit drive signal while said connecting circuit is an N-channel MOS transistor which receives, at the gate thereof, the testing drive signal.

4. A semiconductor integrated circuit as claimed in claim 2, further comprising an inverter for inverting the testing circuit drive signal and providing as an output an inverted testing circuit drive signal, and wherein said circuit is a CMOS inverter comprising a P-channel MOS transistor and an N-channel MOS transistor, and said first power source connecting end is provided on a P-channel MOS transistor side of said CMOS inverter while said second power source connecting end is provided on an N-channel MOS transistor side of said CMOS inverter, and said power supply circuit is an N-channel MOS transistor which receives, at the gate thereof, the inverted testing circuit drive signal while said connecting circuit is a P-channel MOS transistor which receives, at the gate thereof, the inverted testing circuit drive signal.

5. A semiconductor integrated circuit as claimed in claim 2, further comprising an inverter for inverting the testing circuit drive signal and providing as an output an inverted testing circuit drive signal, and wherein said circuit includes first and second N-channel MOS transistors connected in series and said first power source connecting end is provided on a first N-channel MOS transistor side while said second power source connecting end is provided on a second N-channel MOS transistor side, and said power supply circuit is an N-channel MOS transistor which receives, at the gate thereof, the inverted testing circuit drive signal while said connecting circuit includes a first NAND circuit having an output end connected to the gate of said first N-channel MOS transistor, an input end to which a first internal signal is applied and another input end to which the output of said inverter is applied, and a second NAND circuit having an output end connected to the gate of said second N-channel MOS transistor, an input end to which a second internal signal is applied and another input end to which the output of said inverter is applied.

* * * * *